(12) United States Patent
Nasman et al.

(10) Patent No.: US 10,685,857 B2
(45) Date of Patent: Jun. 16, 2020

(54) DISPENSE NOZZLE WITH A SHIELDING DEVICE

(71) Applicant: Tokyo Electron Limited, Tokyo (JP)

(72) Inventors: Ronald Nasman, Averill Park, NY (US); Lior Huli, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 228 days.

(21) Appl. No.: 15/972,910

(22) Filed: May 7, 2018

(65) Prior Publication Data

US 2018/0254202 A1 Sep. 6, 2018

Related U.S. Application Data

(62) Division of application No. 15/287,040, filed on Oct. 6, 2016, now abandoned.

(60) Provisional application No. 62/241,325, filed on Oct. 14, 2015.

(51) Int. Cl.
*H01L 21/67* (2006.01)
*B05B 1/28* (2006.01)

(52) U.S. Cl.
CPC .......... *H01L 21/67051* (2013.01); *B05B 1/28* (2013.01); *H01L 21/6708* (2013.01); *H01L 21/6715* (2013.01)

(58) Field of Classification Search
None
See application file for complete search history.

(56) References Cited

U.S. PATENT DOCUMENTS

| 5,662,266 | A | 9/1997 | Zurecki et al. |
| 7,703,188 | B2* | 4/2010 | Feick ..................... B23P 15/007 264/328.15 |
| 7,959,708 | B2 | 6/2011 | Mahoney et al. |
| 2004/0087158 | A1* | 5/2004 | Izumi ........................ B08B 3/02 438/689 |
| 2008/0111008 | A1 | 5/2008 | Hulet |
| 2010/0044930 | A1 | 2/2010 | Mahoney et al. |
| 2010/0175714 | A1 | 7/2010 | Nagai et al. |
| 2013/0267099 | A1 | 10/2013 | Yu et al. |

* cited by examiner

*Primary Examiner* — Nathan T Leong
(74) *Attorney, Agent, or Firm* — Wood Herron & Evans LLP (57) ABSTRACT

Provided is a nozzle system for dispensing a dispense chemical onto a substrate, the system comprising: a nozzle comprising a nozzle body and a nozzle tip; a shielding device coupled to the nozzle tip, the shielding device configured to create a mini-environment for a dispense chemical such that a partial pressure of the dispense chemical is maintained in the shielding device; wherein the nozzle system is configured to meet selected dispense objectives.

8 Claims, 11 Drawing Sheets

DISPENSE NOZZLE WITH A SHIELDING DEVICE

BACKGROUND OF THE INVENTION

Field of the Invention

The invention relates to a system and method for keeping the substrate clean and free of particles and specifically to a system and method of ensuring that dispense nozzles are clean and free of particles and do not allow the dispense chemical to drift into the substrate after the dispensing of the chemical.

Description of Related Art

Dispense nozzles for resist, solvent and other semiconductor chemicals must be kept clean and free of particles in order to eliminate defects on processed substrates. Additionally, a nozzle must not drip at the completion of the dispense, which can also lead to substrate defects. In most advanced track tools, suck back valves have been incorporated to eliminate the possibility of drips as well as reduce evaporation at the tip of the nozzle. As the chemicals in the resist evaporate, they can leave behind dried particles which can easily be transferred to the substrate. If the chemical is left exposed at the tip of the nozzle, the evaporated gas is quickly blown from the surface as the nozzle is moved from position to position, thereby maintaining a low partial pressure and a high evaporation rate. By sucking the chemical back into the tube, a micro-environment is created in the vacated part of the tube where a high partial pressure can be maintained and which is only reduced via diffusion, a much slower process thereby reducing the particle generation rate due to evaporation.

The drawback to such an approach is the complexity of the required suck back hardware, which is typically incorporated into the dispense valve. It would be advantageous in terms of cost, weight, and system complexity to eliminate the suck back feature, which is one the objects of this invention.

Proper nozzle tip and valve design combined with precision operation enables the flow to be shut off without the risk of additional drops. In this state, the dispense chemical is held at the tip of the nozzle by the surface tension of the dispense chemical. There is a need for a shielding device and method where a mini-environment is created around the nozzle tip similar to the environment created in the nozzle tip during suck back. The shielding device needs to prevent external air movements from rapidly purging away the evaporated gas, thereby providing the same protection without the added complexity of a suck back process.

SUMMARY OF THE INVENTION

Provided is a nozzle system for dispensing a dispense chemical onto a substrate, the system comprising: a nozzle comprising a nozzle body and a nozzle tip; a shielding device coupled to the nozzle tip, the shielding device configured to create a mini-environment for a dispense chemical such that a partial pressure of the dispense chemical is maintained in the shielding device; wherein the nozzle system is configured to meet selected dispense objectives.

Also provided is a nozzle system coupled to a semiconductor fabrication system, the nozzle system comprising: a dispense chemical supply line; a nozzle coupled to the dispense chemical supply line, the nozzle comprising a nozzle body and nozzle tip, nozzle tip coupled to the nozzle body and configured to dispense the dispense chemical onto the substrate; a nozzle valve coupled to the nozzle body and the dispense chemical supply line, the nozzle valve having an opening and closing rate; and a shroud coupled to the nozzle tip and configured to create a mini-environment for the dispense chemical such that a partial pressure of the dispense chemical is maintained in the nozzle shroud, the shroud having a shroud volume, shroud wall thickness, and shroud inner wall diameter; wherein the nozzle system is configured to meet selected dispense objectives.

Furthermore, provided is a method of controlling a dispense nozzle with a shroud in processing a structure on a substrate, the method comprising: providing a nozzle system coupled to a fabrication system, the nozzle system comprising a nozzle body, a nozzle valve, a nozzle tip, and a shielding device; providing a substrate to be processed inside the processing chamber of the fabrication system; starting dispense of the dispense chemical by opening the nozzle valve to flow the dispense chemical onto a substrate in a processing chamber of the fabrication system; stopping dispense of the dispense chemical by closing the nozzle valve to stop the flow of the dispense chemical; controlling, using a controller, the dispensing of the dispense chemical in order to achieve one or more dispense objectives.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 1 is an exemplary schematic of a nozzle system with a shielding device that creates an advantageous mini-environment around the nozzle in order to achieve dispense objectives;

FIG. 2 is an exemplary schematic of the nozzle system with a shroud where there is zero flow of the dispense chemical in an embodiment of the present invention;

FIG. 3 is an exemplary schematic of the nozzle system with a shroud where the dispense chemical is being dispensed onto a substrate in an embodiment of the present invention;

FIG. 4 is an exemplary schematic of the nozzle system with a shroud where the dispense of the dispense chemical has been stopped in an embodiment of the present invention;

FIG. 5 is an exemplary schematic of the nozzle system with a shroud is positioned above a tray of the dispense chemical in an embodiment of the present invention;

FIG. 6 is an exemplary schematic of the shroud highlighting the key dimensions;

FIG. 7 is an exemplary schematic of a nozzle system with a shield gas in an embodiment of the present invention;

FIG. 8 is an exemplary schematic of the nozzle system using a shield gas where there is a plurality of nozzles in an embodiment of the present invention;

FIG. 9 is an exemplary flowchart of operations of a nozzle system with a shroud in an embodiment of the present invention;

FIG. 10 is an exemplary flowchart of operations of a nozzle system using a shielding device in an embodiment of the present invention; and FIG. 11 is an exemplary flowchart of a fabrication system with a nozzle system using a shielding device in an embodiment of the present invention.

DETAILED DESCRIPTION OF SEVERAL EMBODIMENTS

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation. For this application, the words substrate and workpiece are used interchangeably.

A more complete appreciation of the invention and many of the attendant advantages thereof will become readily apparent with reference to the following detailed description, particularly when considered in conjunction with the accompanying drawings.

Chemicals used in semiconductor processes must be kept clean and particle free in order to limit the number and size of defects created on wafers during process. One source of particle generation on liquid delivery systems is the dispense nozzle. Particles at the nozzle tip can be generated in two ways. The first is by evaporation of the dispense chemical at the tip of the nozzle, which may crystalize as the material is being delivered. The second is by chemical reaction between the dispense chemical and the surrounding air, to which it is now exposed. When the dispense chemical is not being dispensed, the dispense chemical may be exposed to the air for extended periods of time. Suck back valves may slow evaporation by maintaining a higher vapor pressure at the dispense chemical surface via the creation of a small mini-environment at the dispense chemical surface, limiting the evaporation rate to the diffusion rate of the dispense chemical. Evaporation is not eliminated completely, however. In addition, no protection from airborne molecules, such as oxygen or water, which may react with the dispense chemical, is provided. The addition of a shroud, use of a shield gas, or a combination of both as described in this disclosure, address these concerns.

Figure 1:
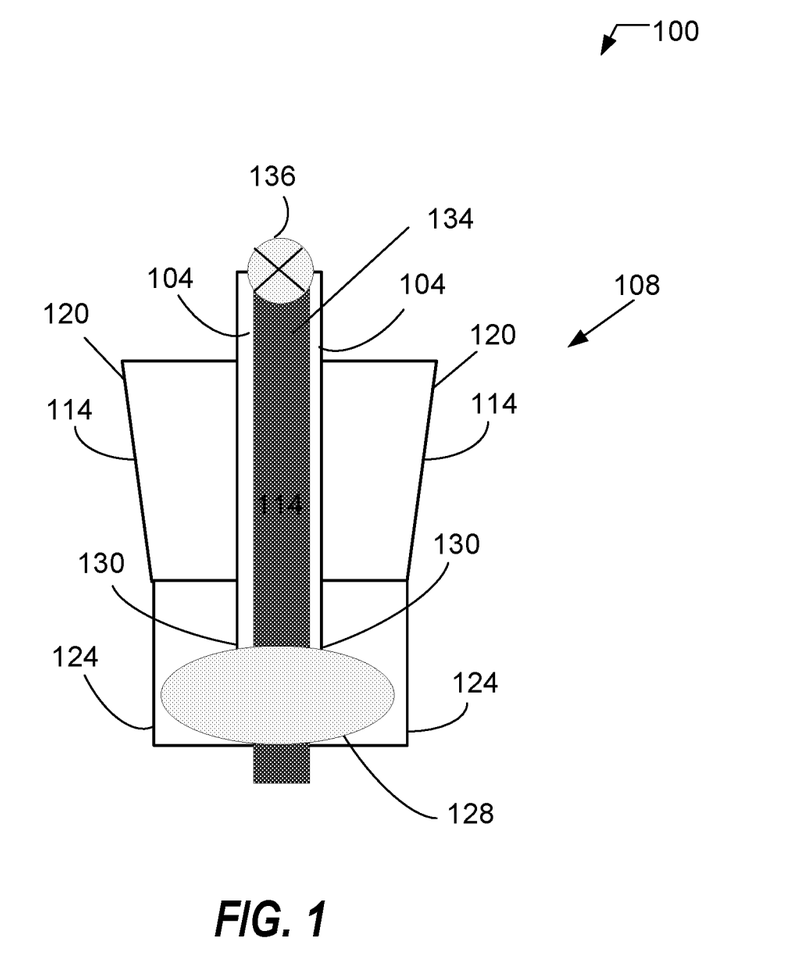

FIG. 1 is an exemplary schematic 100 of a nozzle system 108 with a shielding device 124 that creates an advantageous mini-environment 128 around the nozzle tip 130 in order to achieve dispense objectives. The nozzle system 108 comprises a nozzle 114, a dispense chemical 134, and a shielding device 124. The nozzle 114 includes a dispense delivery pipe 104, a nozzle body 120, a nozzle valve 136, and a nozzle tip 130. If the shielding device 124 is a shroud, the mini-environment 128 is disposed inside the area surrounded by the shroud. Other configurations of shielding devices can include shield gas or a combination of a shroud and a shield gas or the like. As will be discussed below, these variations and others are included in this invention.

Still referring to FIG. 1, the nozzle valve 136 must be maintained in operational condition so that flow of the dispense chemical 134 can be controlled in a precise manner. The ideal function for the rate of closure of the nozzle valve 136 varies based on fluid properties, especially viscosity. In the closing operation for the nozzle system 108, the dispense chemical 134 at the nozzle tip 130 should be as flat as possible, i.e., not bulging out in order to minimize the surface area exposed. This will be covered in detail below.

Figure 2:
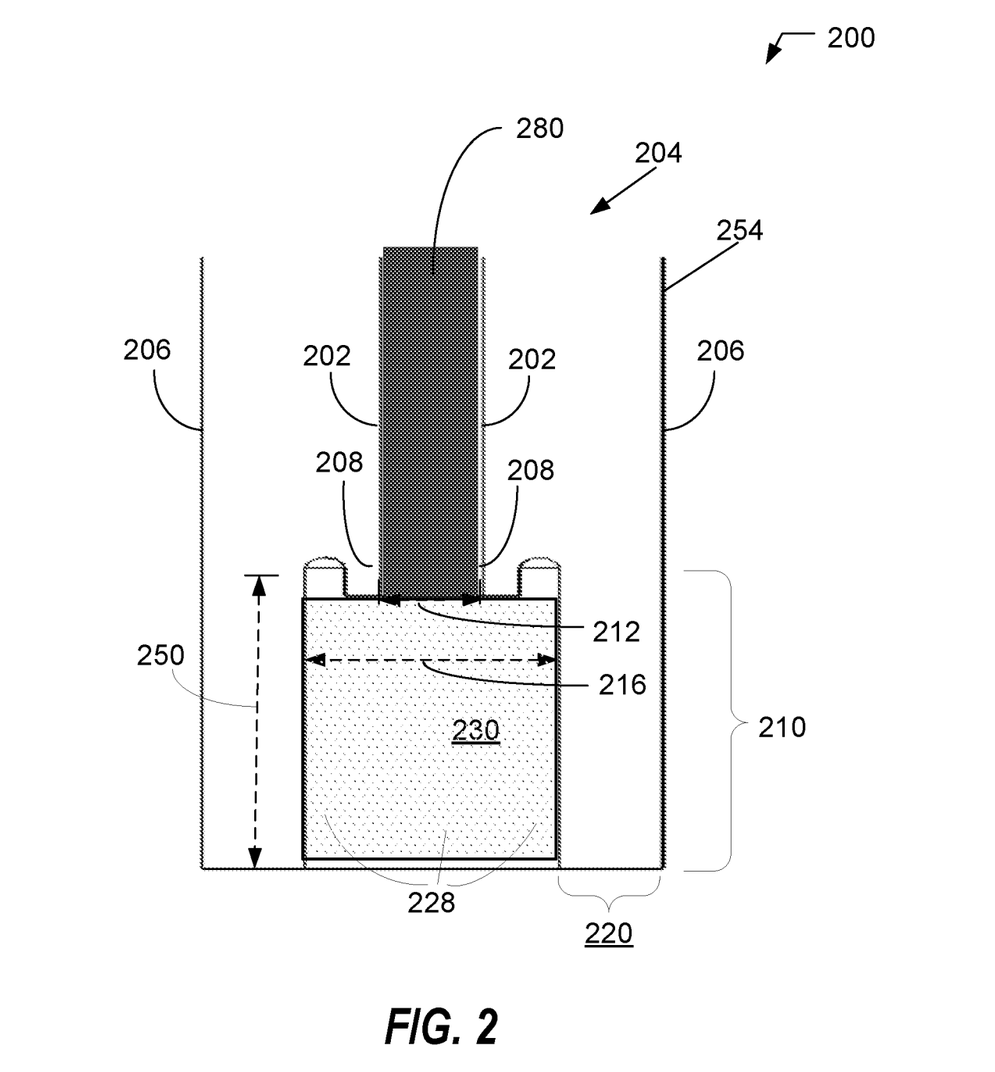

FIG. 2 is an exemplary schematic 200 of the nozzle system 204 with a shroud 210 where there is zero flow of the dispense chemical 280 in an embodiment of the present invention. The nozzle 254 includes a nozzle body 206, a dispense chemical delivery pipe 202 delivering the dispense chemical 280. The nozzle 254 also includes a nozzle tip 208 and a nozzle outlet 212. The shroud 210 may be made of the same material as the nozzle 254 or some other material that is appropriate for the dispense chemical 280 being handled. Other dimensions of the shroud 210 include a shroud height 250, a width 216, a shroud volume 228 containing the chemical vapor 230, and a thickness of the shroud wall 220. The dispense chemical 280 is positioned inside the dispense chemical delivery pipe 202 and goes all the way to the nozzle tip 208. The dispense chemical 280 is kept from going into the shroud volume 228 by surface tension of the dispense chemical 280. The shroud volume 228 has a stable partial pressure of the dispense chemical 280 in the shroud volume 228. Effectively, a mini-environment inside the shroud volume 228 is created around the nozzle tip 208, similar to the environment created in the nozzle after a suck back of the dispense chemical 280 in prior art method of using a suck back step. In the present invention, the partial pressure of the dispense chemical 280 in the shroud volume 228 is generated as the dispense chemical 280 passes through the shroud area. In addition, the shroud 210 prevents external air movements from rapidly purging the evaporated dispense chemical 280, thereby providing the same protection as the suck back procedure without the added complexity of the suck back mechanism.

Figure 3:
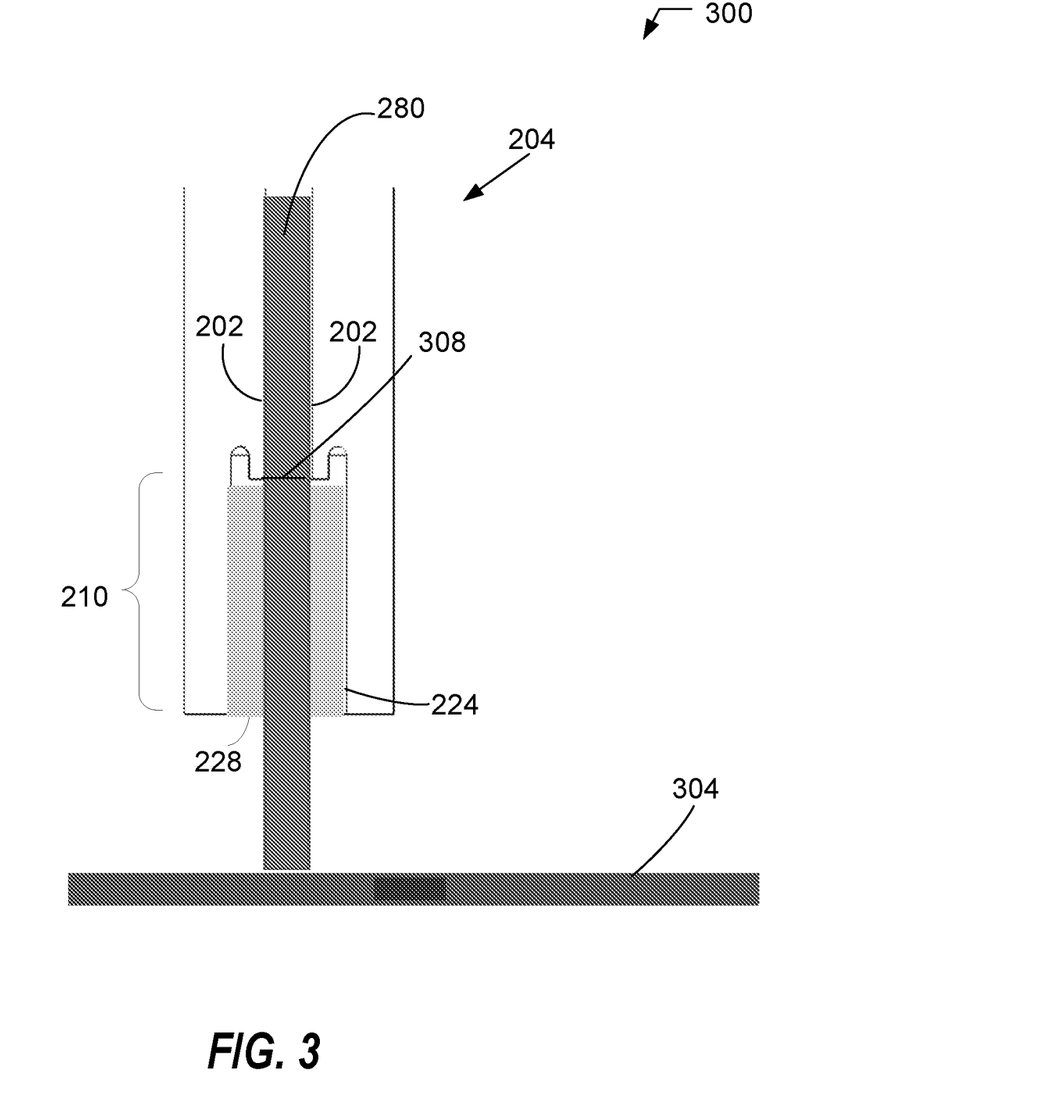

FIG. 3 is an exemplary schematic 300 of the nozzle system 204 with a shroud 210 where the nozzle system 204 is flowing the dispense chemical 280 onto the substrate 304 in an embodiment of the present invention. The dispense chemical 280 flows into the dispense chemical delivery pipe 202, through a nozzle internal opening 308 and through the center of the shroud 210 without touching the inside wall of the shroud 224. During this time, some of the dispense chemical 280 evaporates inside the shroud volume 228 and the partial pressure of the dispense chemical 280 in the shroud volume 228 rises. The partial pressure of the dispense chemical 280 in the shroud volume 228 can be monitored with metrology equipment (not shown) and such measurements can be transmitted to a controller (not shown) that can use that data to adjust the partial pressure in the preferred range.

Figure 4:
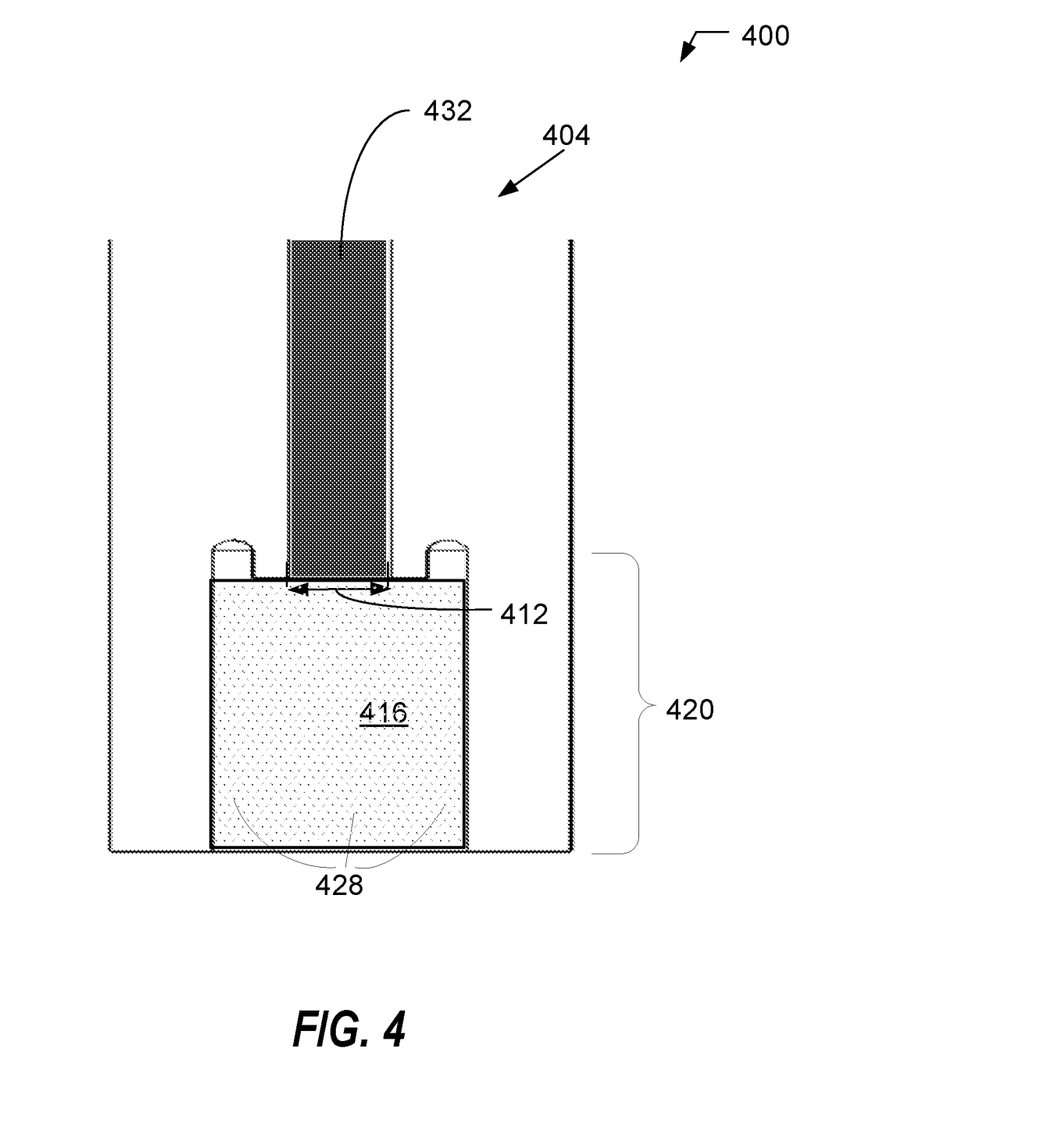

FIG. 4 is an exemplary schematic 400 of the nozzle system 404 with a shroud 420 where the flow of the dispense chemical 432 has been stopped in an embodiment of the present invention. The evaporated dispense chemical 416 fills the shroud volume 428 and helps to prevent evaporation at the surface 412 of dispense chemical 432. As the nozzle system 404 is moved, air would blow across the opening of the shroud 420 and increase diffusion out of the shroud 420. Some evaporation of the dispense chemical 432 may occur as the vapor pressure of the dispense chemical is maintained within the shroud volume 428. Even with the movement of nozzle system 404, the dispense chemical 432 continues to show a high vapor pressure at the surface 412. Without the shroud 420, the air would blow across the surface 412 of the dispense chemical 432 and dramatically reduce the vapor pressure at the dispense chemical 432 surface 412 and cause a correspondingly high evaporation rate. In summary, the shroud 420 minimizes the evaporation rate from the surface 412 of the dispense chemical 432 and minimize the diffusion rate of the dispense chemical vapor 416 out of the shroud 420.

Figure 5:
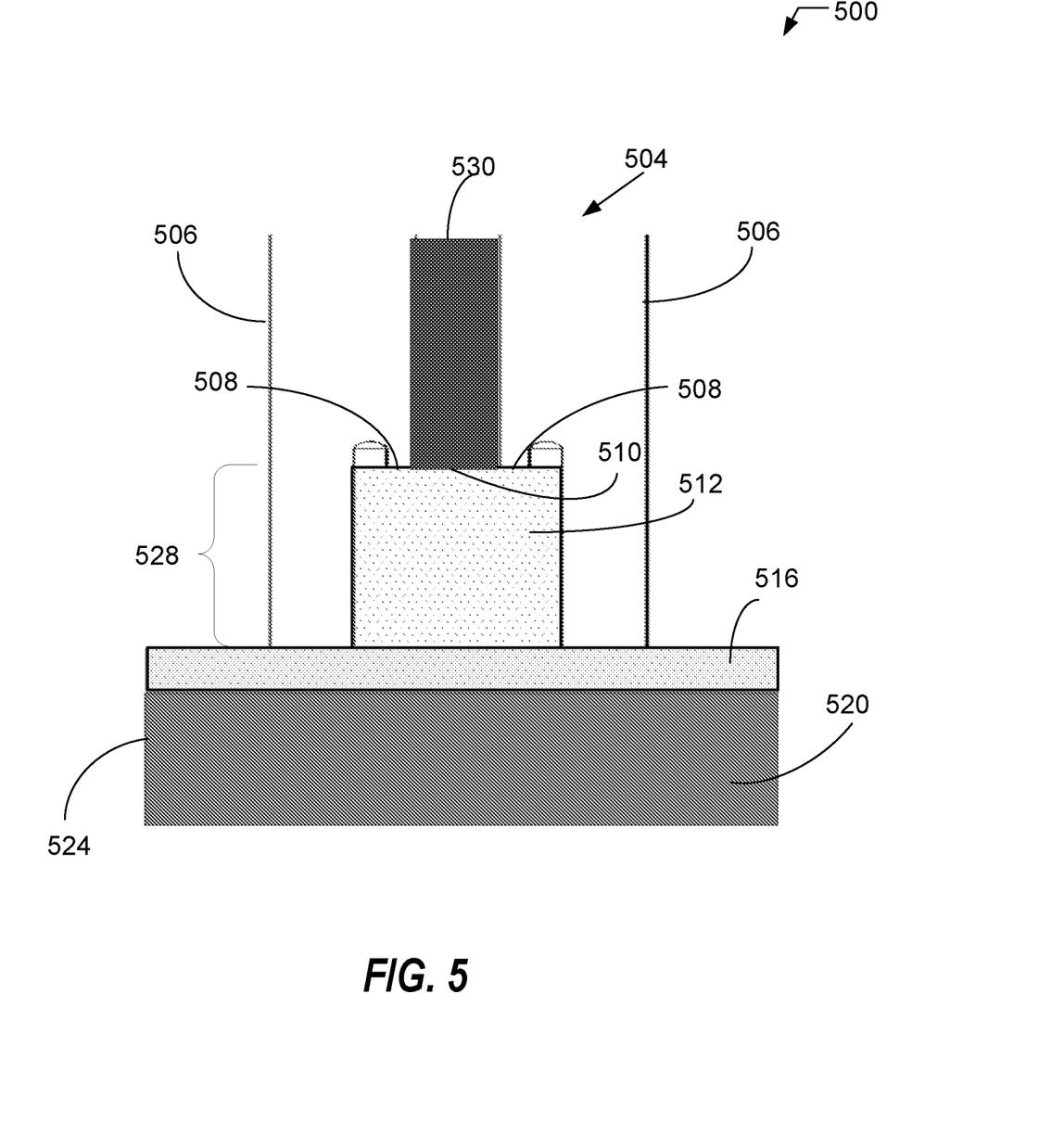

FIG. 5 is an exemplary schematic 500 of the nozzle system 504 with a shroud 528 disposed in a tray 524 containing a tray chemical 520 in an embodiment of the present invention. To further aid in the minimizing the undesired evaporation at the surface 510 of the dispense chemical 530, the nozzle 506 is placed in close proximity above the tray 524 containing the tray chemical 520. The tray chemical can comprise the dispense chemical or the dispense chemical and a solvent. The top portion of the tray 524 is not filled with the tray chemical 520 leaving the unfilled portion with vapors 516. There is no contact between the nozzle shroud 528 and the tray chemical 520 in the tray 524, thus, there is no transfer of particles (not shown) from the tray chemical 520 in the tray 524 to the nozzle shroud 528 and the nozzle tip 508. There is also no contact between the nozzle shroud 528 and the tray chemical 520 in the tray 524. Positioning the nozzle system 504 above the tray 524 allows the partial pressure of the dispense chemical 530 in the shroud volume 512 to be maintained for an extended period of time.

Figure 6:
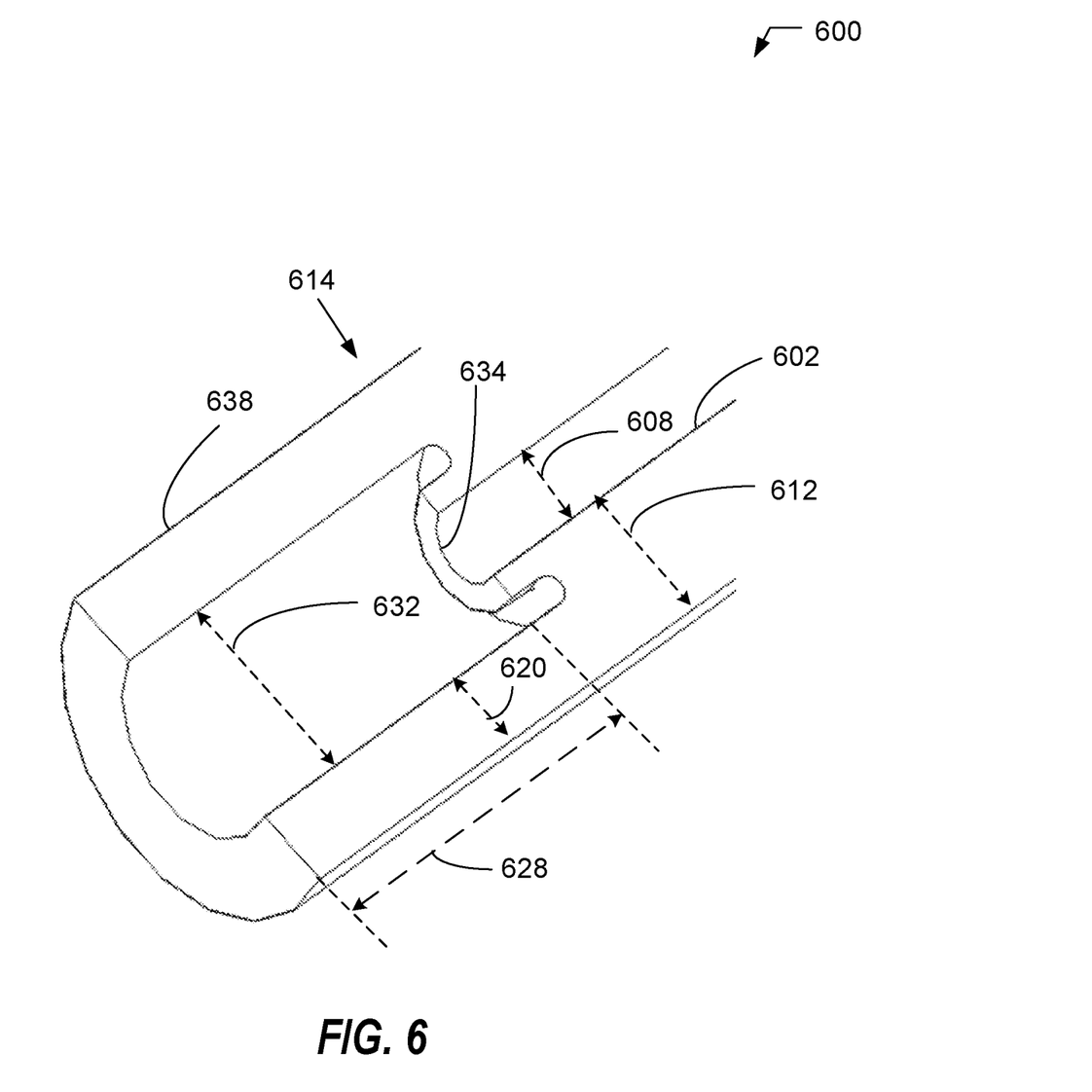

FIG. 6 is an exemplary three-dimensional schematic 600 of the shroud 628 highlighting key dimensions of the shroud 628 relative to the nozzle system 614. The critical dimensions include the diameter 608 of the nozzle inside the opening 634, distance 612 from outside the nozzle to the inner wall of the nozzle 602, the height 628 of the shroud 638, the shroud wall thickness 620, and the inner wall diameter 632 of the shroud 638.

Figure 7:
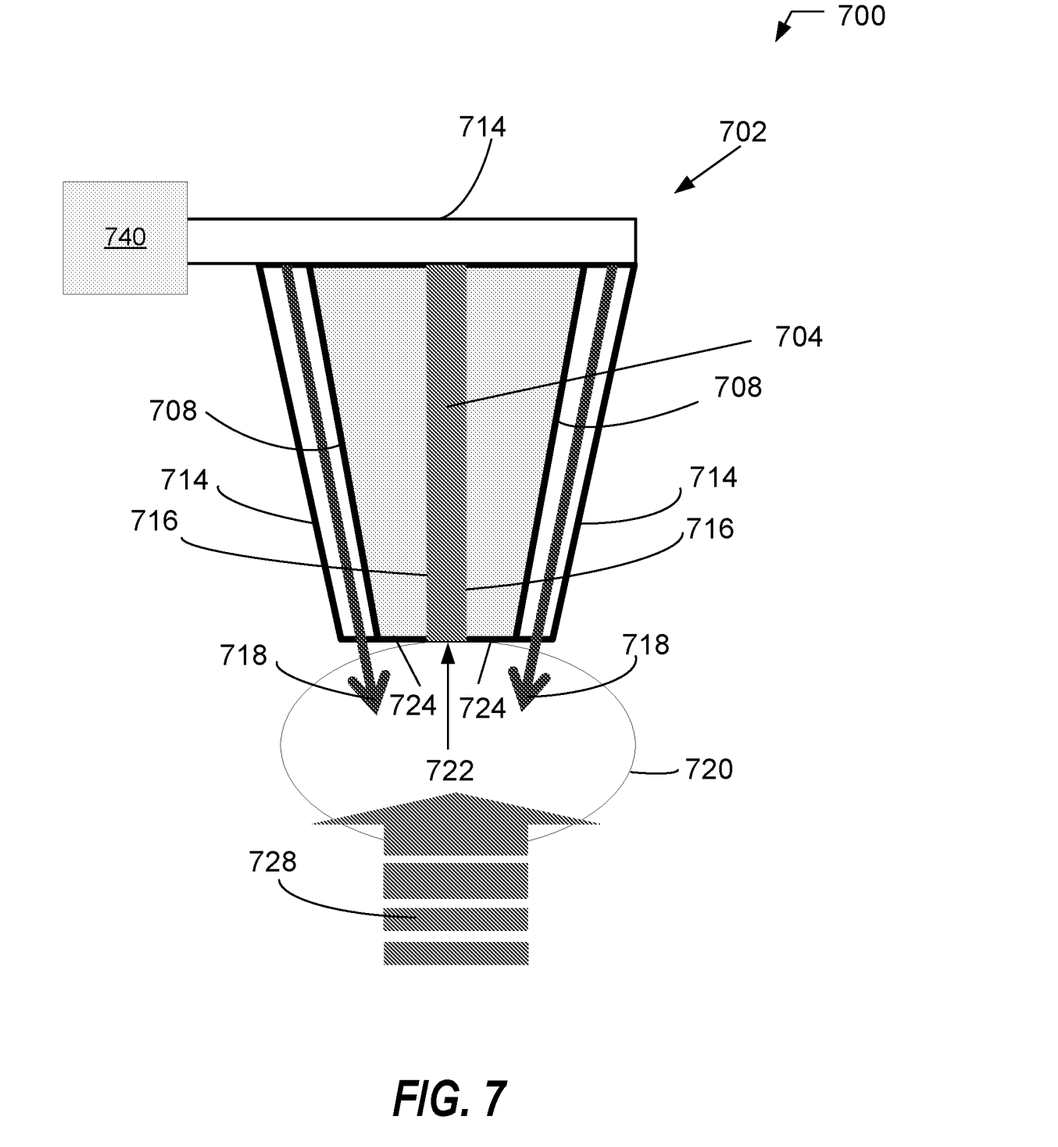

FIG. 7 is an exemplary schematic 700 of the nozzle system 702 with a shielded zone 720 in an embodiment of the present invention. The nozzle system 702 comprises a nozzle 708, a dispense chemical delivery pipe 716, shielding gas delivery pipe 714, shielded zone 720, and a reactive gas area 728.

Figure 8:
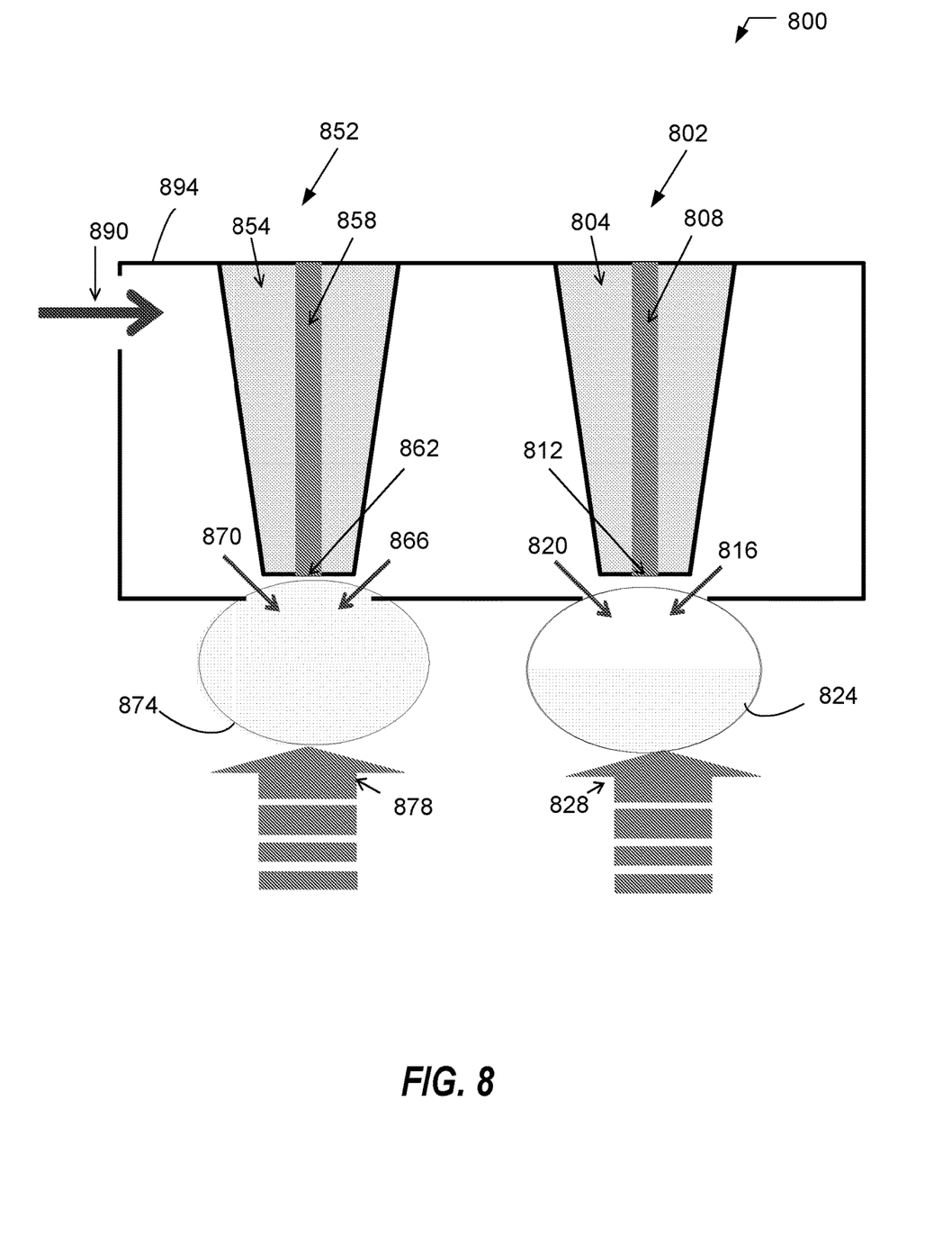

The gas flow 718 is a gas mixture which is both nonreactive to the dispense chemical 704 being dispensed and also saturated with the vapor of the dispense chemical 704 that is directed as a gas flow 718 proximate to the nozzle tip 724. Since the shielded zone 720 is already saturated with the vapor of the dispense chemical 704, evaporation from the nozzle tip 724 area is prevented. The gas flow 718 is provided with sufficient energy so that it pushes away airborne reactants in the reactive gas area 728 faster than these can diffuse to the surface of the dispense chemical 722, then chemical reaction with the environment is also prevented.

The embodiment includes: a) supplying a gas flow 718 where the gas flow 718 comprises one or more gases, b) directing the gas flow 718 proximate to the nozzle tip 724, c) preventing evaporation from around the nozzle tip 724 since the gas flow is already saturated with the vapor of the dispense chemical 704. For net evaporation to occur, the gas immediately above or below the surface of the dispense chemical 704 must be below the saturation point of the dispense chemical 704 vapor. Net evaporation occurs rapidly until saturation at the surface 722 of the dispense chemical 704 occurs. The high concentration of the dispense chemical 704 vapor at the surface 722 of the dispense chemical 704 then diffuses into the surrounding gas. Evaporation continues in order to replace the molecules that have diffused away. Diffusion is driven by concentration gradient of the dispense chemical 704 in the area close to the nozzle tip 724. By supplying a saturated gas flow 718 to the volume around the nozzle tip 724, the concentration gradient tends towards zero and diffusion to the environment from the surface 722 of the dispense chemical 704 is blocked. With diffusion eliminated, evaporation of the dispense chemical 704 is also terminated.

As mentioned above, the gas flow 718 can be provided with sufficient energy that pushes away airborne reactive gases faster than these can diffuse to the surface 722 of the dispense chemical 704, then chemical reaction with the airborne gases in the reactive gas area 728 is also prevented. Diffusion occurs as Brownian motion and at typical atmospheric pressures; the large number of molecular collisions limits the progression of diffusing gases. If viscous gas flow 718 is supplied against the diffusing reactive gases 728 at a velocity higher than the speed of diffusion, the progression of the diffusing reactive gases from the reactive gas area 728 is halted.

In some cases, the dispense chemical 704 is a compound of substances which may include a volatile solvent combined with heavier, less volatile chemicals. In such cases, the solvent is at a much higher risk of evaporation, leaving behind the less volatile components to coagulate or crystalize. In order to avert this action, the gas flow 718 need only contain a saturated level of the solvent, which typically provides for a significantly lower cost option.

The shield gas delivery pipe 714 can be supplied by a shield gas generator 740 which can be a bubbler where the inert gas supply (not shown) is plumbed to the bottom of the shield gas generator 740 filled with a solvent or the dispense chemical 704, from which it bubbles up to a shield gas delivery pipe 714 that is provided as an annular gas flow 718 around the nozzle 708 and released proximate to the nozzle tip 724. The shield gas generator 740 can also be a vaporizer or a similar device. A carrier gas may also be added to the shield gas or included in the shield gas as long as such a carrier gas is nonreactive with the dispense chemical 704. Noble gases such as argon can be used, or nitrogen gas, N2, if shown to be a compatible lower cost option, may be used as carrier gases.

The shield gas may be supplied to each nozzle individually as shown in FIG. 7 or supplied in a plenum arrangement if multiple nozzles share the same shield gas setup as in FIG. 8 described below. The shield gas concept can be used in conjunction with a standard nozzle, a nozzle with a suck back valve behind it, or with a nozzle that incorporates a shroud.

FIG. 8 is an exemplary schematic 800 of the nozzle system, 802 and 852, with a shield gas where there is a plurality of nozzles, 804 and 854, in a nozzle bank or plenum 894 in an embodiment of the present invention. In the embodiment, the shield gas generator (not shown) generates the shield gas 890 and is used in the nozzle bank 894 to supply a shield gas flow, 870 and 866, 820 and 816, proximate to the respective surfaces, 862 and 812, of the nozzles, 804 and 854. The shield gas flow, 870 and 866, 820 and 816, is supplied against the diffusing reactive gases, 828 and 878, at a velocity higher than the speed of diffusion, causing the progression of the diffusing reactive gases, 828 and 878, to stop. As mentioned above, by supplying a saturated gas supply to the surfaces, of the dispense chemical in the respective nozzles, 804 and 854, the concentration gradient tends towards zero and diffusion to the environment from the surfaces, 812 and 862, of the dispense chemicals, 808 and 858, are blocked. With diffusion eliminated, the shielded zones, 874 and 824, are already saturated with the vapor of the dispense chemicals, 808 and 858, evaporation from the respective surfaces, 812 and 862, is prevented.

Figure 9:
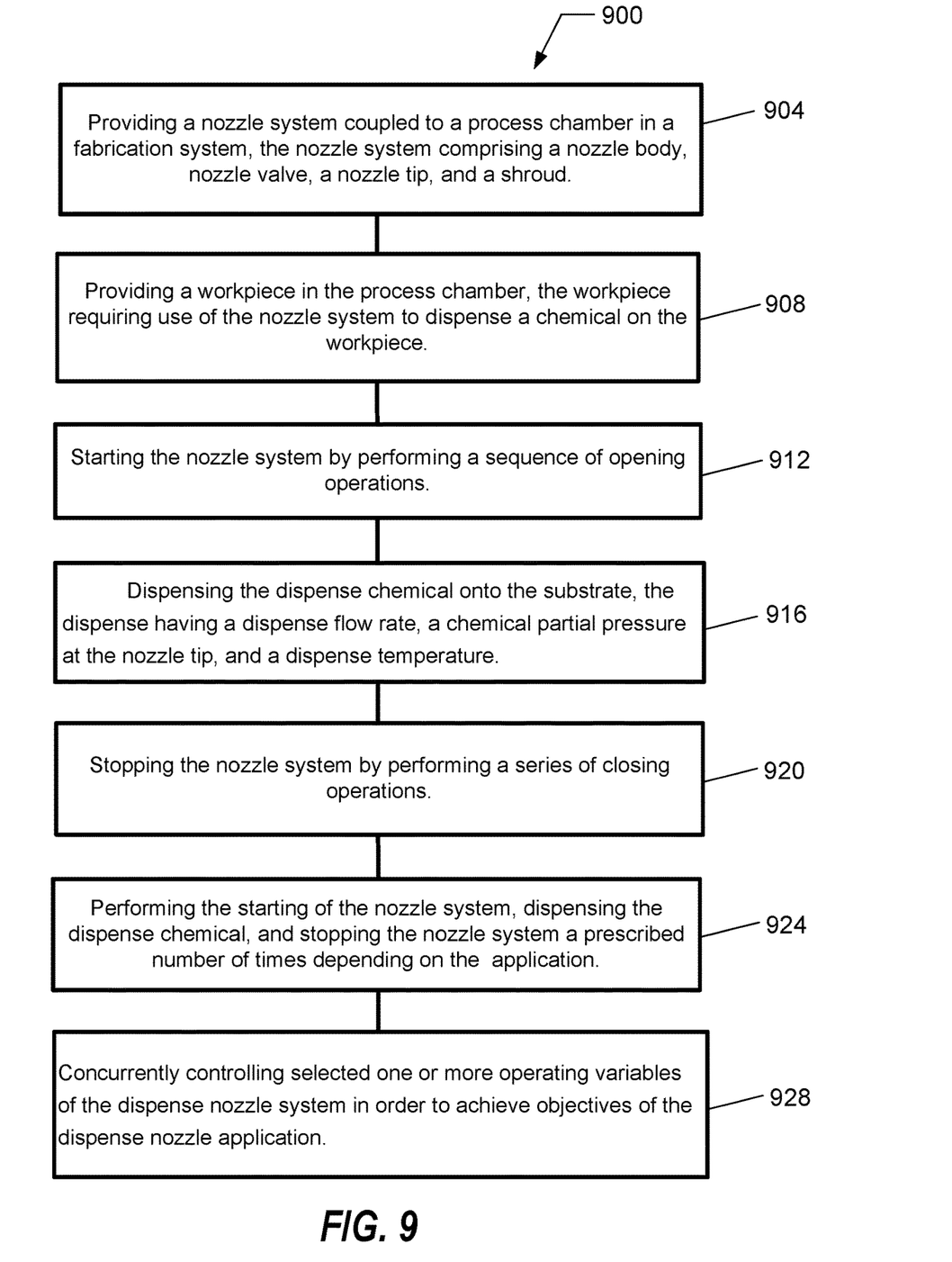

FIG. 9 is an exemplary flowchart 900 of operations of a nozzle system with a shroud in an embodiment of the present invention. In operation 904, a nozzle system coupled to a process chamber in a fabrication system is provided, the nozzle system comprising a nozzle body, nozzle valve, a nozzle tip, and a shroud. The shroud can be an extension of the nozzle body or it can be a different annular material attached to the nozzle body. The fabrication system can be an etch, cleaning, rinsing, or liquid treatment system. In operation 908, a workpiece is provided in the process chamber, the workpiece requiring use of the nozzle system to dispense a chemical onto the workpiece. The workpiece can be a wafer, substrate, memory device, flat panel display device, or the like. For simplicity, all later references to the workpiece will instead state a substrate.

In operation 912, the nozzle system is started by performing a sequence of opening operations. The sequence of opening operations may include moving an arm containing the one or more nozzle systems from a standby position to a specific position above the substrate. Another opening operation may include moving the nozzle from a tray partially filled with the tray chemical or dispense chemical and a solvent to the specific position above the substrate. If this is the first time the nozzle system is being used, an opening sequence of operations may include flowing the dispense chemical to the inner opening of the nozzle in order to start increasing the partial pressure of the dispense chemical in the shroud or mini-environment space below the nozzle inner opening. In operation 916, the dispense chemical is dispensed onto the substrate, the dispense having a dispense flow rate, a dispense chemical partial pressure at the nozzle tip, and a dispense temperature. During this operation, static electrical energy may build up in the nozzle system during the dispense operation. Static electrical energy issues can be eliminated by providing a conductive grounded surface on the inside wall of the shroud.

Still referring to FIG. 9, in operation 920, the nozzle system is stopped by performing a sequence of closing operations. The sequence of closing operations may include moving the arm containing the one or more nozzle systems from a specific position above the substrate to a standby position. Another closing operation may include moving the nozzle from specific position above the substrate to a tray partially filled with the tray chemical. Still another closing operation may include rinsing the nozzle system in preparation for another, different dispense chemical. In operation 924, sequence of operations including the starting of the nozzle system, dispensing the dispense chemical, and stopping of the nozzle system is performed a prescribed number of times depending on the application. In operation 928, selected one or more operating variables of the nozzle system are concurrently controlled in order to achieve objectives of the dispense nozzle application. The objectives of the dispense nozzle application can include no dripping of dispense chemical when dispense has stopped, no particle contamination of substrate, and/or lower cost of ownership.

Figure 10:
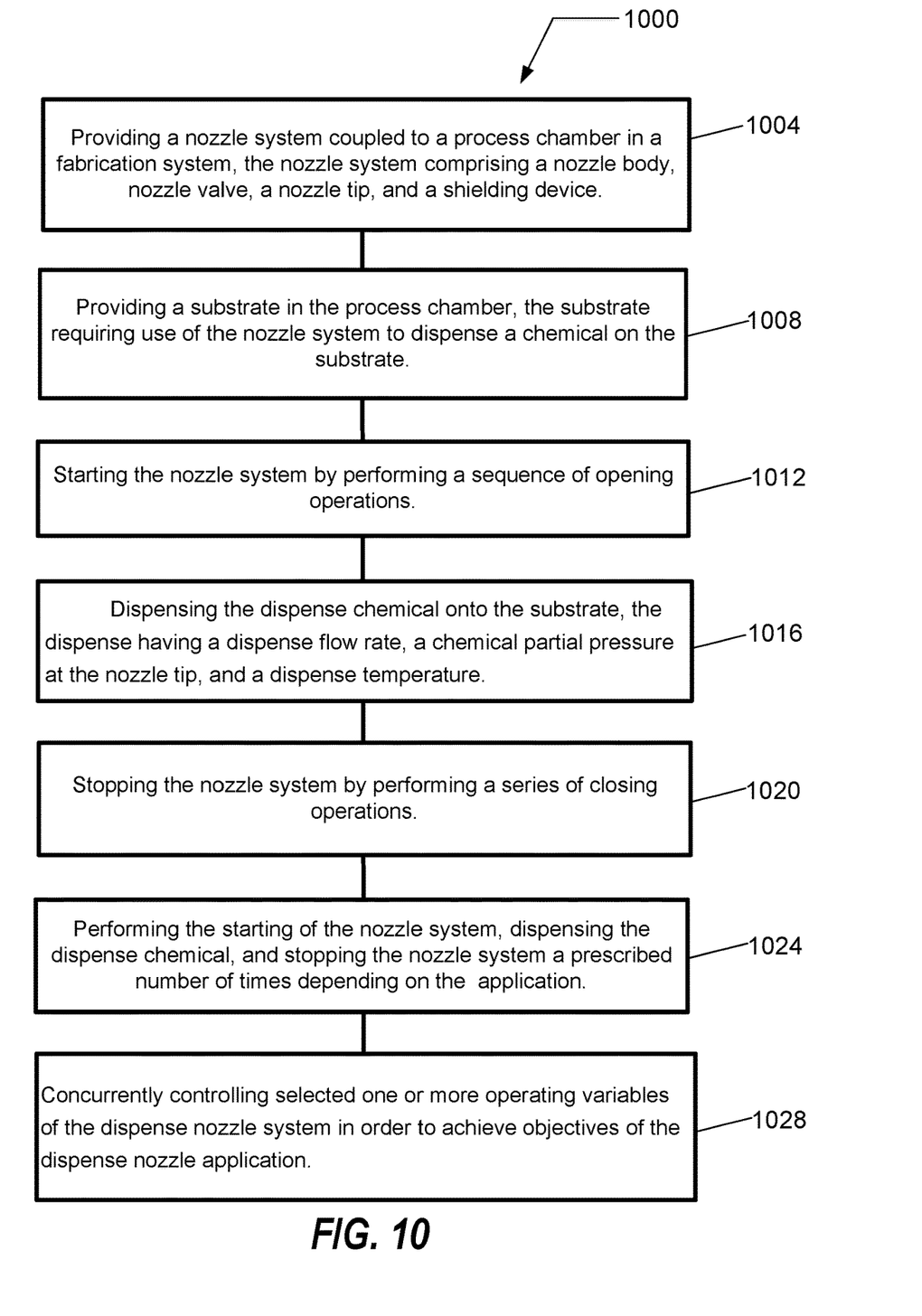

FIG. 10 is an exemplary flowchart 1000 of operations of a nozzle system with a shielding device in an embodiment of the present invention. In operation 1004, a nozzle system coupled to a process chamber in a fabrication system is provided, the nozzle system comprising a nozzle body, nozzle valve, a nozzle tip, and a shielding device. The shielding device can be a shield gas such as the shield gas described in relation to FIG. 7 and FIG. 8. Alternatively, the shielding device may also use a nozzle with a shroud. Other variations of the shroud and the shield gas may also be used. As stated above, the fabrication system can be an etch, cleaning, rinsing, or liquid treatment system. In operation 1008, a substrate is provided in the process chamber, the substrate requiring use of the nozzle system to dispense a chemical onto the substrate.

In operation 1012, the nozzle system is started by performing a sequence of opening operations. The sequence of opening operations may include moving an arm containing the one or more nozzle systems from a standby position to a specific position above the substrate. Another opening operation may include moving the nozzle from a tray partially filled with the dispense chemical or the dispense chemical with a solvent to the specific position above the substrate. If this is the first time the nozzle system is being used, an opening sequence of operations may include flowing the dispense chemical through the dispense chemical delivery pipe to the inner opening of the nozzle in order to start increasing the partial pressure of the dispense chemical in the gas-shielded space, shrouded space or mini-environment space below the nozzle inner opening. In operation 1016, the dispense chemical is dispensed onto the substrate, the dispense having a dispense flow rate, a dispense chemical partial pressure at the nozzle tip, and a dispense temperature.

Still referring to FIG. 10, in operation 1020, the nozzle system is stopped by performing a sequence of closing operations. The sequence of closing operations may include moving the arm containing the one or more nozzle systems from a specific position above the substrate to a standby position. Another closing operation may include moving the nozzle from specific position above the substrate to a tray partially filled with the tray chemical. Still another closing operation may include rinsing the nozzle system in preparation for another different dispense chemical. In operation 1024, sequence of operations including the starting of the nozzle system, dispensing the dispense chemical, and stopping the nozzle system is performed a prescribed number of times depending on the application. In operation 1028, selected one or more operating variables of the nozzle system are concurrently controlled in order to achieve objectives of the dispense nozzle application. As mentioned above, the objectives of the dispense nozzle application can include no dripping of dispense chemical when dispense has stopped, no particle contamination of substrate, and/or lower cost of ownership.

The delivery of the dispense chemical to the inner opening of the nozzle should be tuned to minimize the surface area of the exposed dispense chemical and to ensure that the surface area is as flat as possible, i.e., not bulging out. By ensuring flatness of the surface area, a mini-environment is created around the nozzle tip similar to the environment created in the nozzle tip using a suck back process. However, in this case, the partial pressure of evaporated dispense chemical is generated by the flow of the dispense chemical passing through the zone including the nozzle tip and does not use a suck back that is typically performed with complex, expensive equipment.

Figure 11:
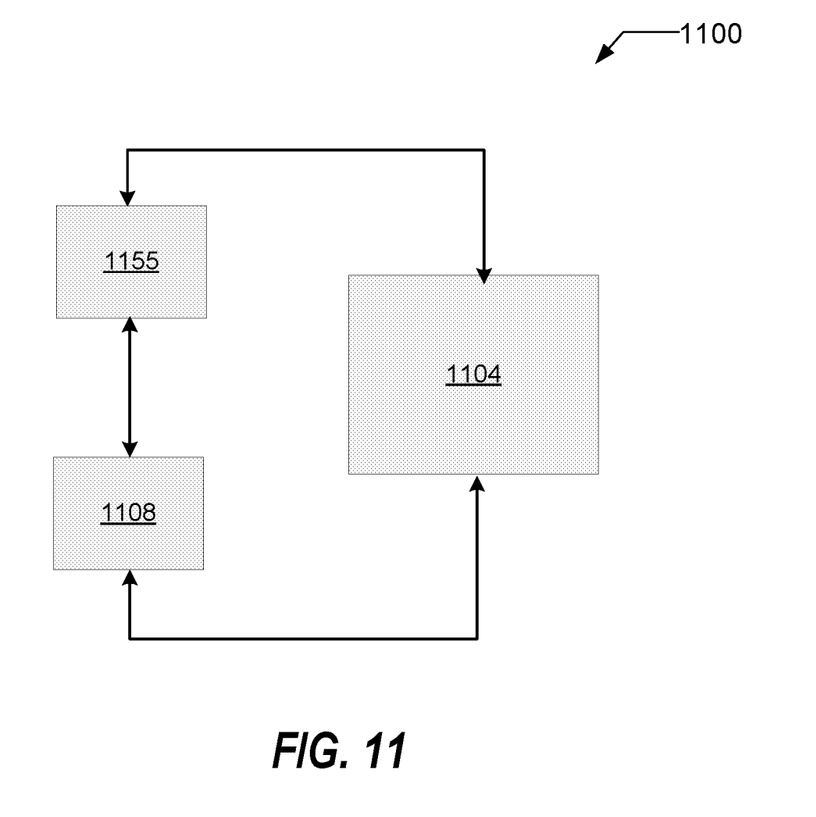

FIG. 11 is an exemplary schematic 1100 of a fabrication system with a nozzle system using a shroud or shielding device in an embodiment of the present invention. The nozzle system 1104 is coupled to a controller 1155 and to a fabrication system 1108. The controller 1155 can comprise a microprocessor, memory, and a digital I/O port capable of generating control voltages sufficient to communicate and activate inputs to the nozzle system 1104 and to the processing system 1108 as well as monitor outputs from processing system 1108. Moreover, controller 1155 can be coupled to and can exchange information with nozzle system 1104 and subsystems of the fabrication system 1108. For example, a program stored in the memory can be utilized to activate the inputs to the aforementioned subsystems of fabrication system 1108 and of the nozzle system 1104 according to a process recipe in order to perform a dispense process on a substrate.

Depending on the applications, additional devices such as sensors or metrology devices can be coupled to the nozzle system 1104 and to the fabrication system 1108 and the controller 1155 can collect real time data and use such real time data to concurrently control one or more selected operating variables in two or more steps involving dispense chemical flow rate, dispense chemical temperature, dispense chemical viscosity, presence of contaminants, partial pressure of the dispense chemical around the nozzle tip, and the like in order to achieve dispense objectives.

Specifically, the controller 1155 coupled to the nozzle system 1104 can be configured to perform sequences of operations based on instructions stored in a storage device, memory, or based on data communicated by the sensor or by external computer networks. One or more sensors can be programmed to detect the presence of contaminants or dripping of the dispense chemical after a dispense and in conjunction with the controller resolve the problem. The fabrication system 1108 can be an etch, cleaning, rinsing, tract, or fluid treatment semiconductor fabrication system. Further, the controller can be configured to utilize selected operating variables which are concurrently controlled to achieve the dispense objectives, the dispense objectives comprising cost of ownership, throughput samples per hour, reduced particle contamination, and reduced usage of the dispense chemical.

Although only certain embodiments of this invention have been described in detail above, those skilled in the art will readily appreciate that many modifications are possible in the embodiments without materially departing from the novel teachings and advantages of this invention. For example, the applications of the principles and techniques of fluid mixing using a spiral mixer where a selected two or more mixing variables are concurrently controlled to meet target objectives have many other uses in addition to semiconductor manufacturing. Accordingly, all such modifications are intended to be included within the scope of this invention.

What is claimed is:

1. A method of controlling a dispense nozzle in processing a substrate, the method comprising:
    providing a nozzle system coupled to a fabrication system, the nozzle system comprising a source of a dispense chemical including one or more semiconductor chemicals capable of evaporating and crystallizing as a material to be delivered or reacting with air and forming particles, a dispense chemical supply line coupled to the source of the dispense chemical, a nozzle body, a nozzle valve coupled to the nozzle body and the dispense chemical supply line, a nozzle tip coupled to the nozzle body, and a nozzle shroud coupled to the nozzle tip;
    providing a substrate to be processed inside a processing chamber of the fabrication system;
    starting dispense of the dispense chemical by opening the nozzle valve to flow the dispense chemical through the nozzle tip and the nozzle shroud onto a substrate in the processing chamber of the fabrication system, wherein during flowing of the dispense chemical, a mini-environment with a partial pressure of the dispense chemical forms in the nozzle shroud;
    stopping dispense of the dispense chemical by closing the nozzle valve to stop the flow of the dispense chemical;
    controlling, using a controller, the starting dispense and stopping dispense of the dispense chemical so as to maintain the partial pressure of the dispense chemical in the shroud when the dispense chemical is not flowing through the nozzle tip so as to prevent evaporating and crystallizing or reacting of the dispense chemical.

2. The method of claim 1 wherein controlling includes achieving one or more nozzle dispensing objectives including no dripping of the dispense chemical after the nozzle valve is closed and wherein partial pressure of the dispense chemical in the nozzle shroud area is kept within a range by controlling a mini-environment of the nozzle shroud.

3. The method of claim 1 wherein controlling includes achieving one or more nozzle dispense objectives including the opening and closing rate of the nozzle valve to handle the viscosity and other fluid characteristics of the dispense chemical.

4. A method of controlling a dispense nozzle in processing on a substrate, the method comprising:
    providing a nozzle system coupled to a fabrication system, the nozzle system comprising a source of a dispense chemical including one or more semiconductor chemicals capable of evaporating and crystallizing as a material to be delivered or reacting with air and forming particles, a dispense chemical supply line coupled to the source of the dispense chemical, a nozzle body, a nozzle valve coupled to the nozzle body and the dispense chemical supply line, a nozzle tip coupled to the nozzle body, a shielding device coupled to the nozzle tip, and a shield gas source coupled to the nozzle;
    providing a substrate to be processed inside a processing chamber of the fabrication system;
    starting dispense of the dispense chemical by opening the nozzle valve to flow the dispense chemical through the nozzle tip and the shielding device onto a substrate in the processing chamber of the fabrication system, wherein during flowing of the dispense chemical, a mini-environment with a partial pressure of the dispense chemical forms in the shielding device;
    stopping dispense of the dispense chemical by closing the nozzle valve to stop the flow of the dispense chemical;

while flowing the dispense chemical, flowing a shielding gas from the shield gas source proximate the nozzle tip, the shielding gas being saturated with the dispense chemical;

controlling, using a controller, supplying of the shielding gas proximate the nozzle tip so as to prevent evaporating and crystallizing or reacting of the dispense chemical when the dispense chemical is not flowing from the nozzle tip.

5. The method of claim 4 wherein controlling includes starting and stopping the dispensing based on one or more dispense objectives including no dripping of the dispense chemical after the nozzle valve is closed and keeping a partial pressure of the dispense chemical in the nozzle shroud area within a range by controlling a mini-environment of the shielding device.

6. The method of claim 4 wherein controlling includes starting and stopping the dispensing based on one or more dispensing objectives including an opening and closing rate of the nozzle valve to handle the viscosity and other fluid characteristics of the dispense chemical.

7. The method of claim 4 wherein the shielding device is a nozzle shroud, a gas shield, or a combination of a nozzle shroud and a gas shield.

8. The method of claim 4 wherein flowing the shielding gas includes bubbling an inert gas through the dispense chemical or the solvent prior to flowing the shielding gas proximate the nozzle tip.

* * * * *

UNITED STATES PATENT AND TRADEMARK OFFICE
CERTIFICATE OF CORRECTION

PATENT NO. : 10,685,857 B2  
APPLICATION NO. : 15/972910  
DATED : June 16, 2020  
INVENTOR(S) : Ronald Nasman et al.

Page 1 of 1

It is certified that error appears in the above-identified patent and that said Letters Patent is hereby corrected as shown below:

In the Claims

Column 10, Lines 43-44, Claim 4, "A method of controlling a dispense nozzle in processing on a substrate, the method comprising" should be --A method of controlling a dispense nozzle in processing a substrate, the method comprising--.

Signed and Sealed this  
Twenty-fifth Day of August, 2020

Andrei Iancu  
*Director of the United States Patent and Trademark Office*